(12) United States Patent
Gao et al.

(10) Patent No.: US 9,142,434 B2
(45) Date of Patent: Sep. 22, 2015

(54) METHOD FOR SINGULATING ELECTRONIC COMPONENTS FROM A SUBSTRATE

(75) Inventors: Wei Gao, Tianjin (CN); Craig S. Amrine, Tempe, AZ (US); Zhiwei Gong, Tianjin (CN); Scott M. Hayes, Chandler, AZ (US); Lizabeth Ann Keser, Chandler, AZ (US); George R. Leal, Cedar Park, TX (US); William H. Lytle, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 296 days.

(21) Appl. No.: 13/125,502

(22) PCT Filed: Oct. 23, 2008

(86) PCT No.: PCT/CN2008/001790
§ 371 (c)(1),
(2), (4) Date: Apr. 21, 2011

(87) PCT Pub. No.: WO2010/045754
PCT Pub. Date: Apr. 29, 2010

(65) Prior Publication Data
US 2011/0217814 A1 Sep. 8, 2011

(51) Int. Cl.
*H01L 21/00* (2006.01)
*H01L 21/67* (2006.01)
(Continued)

(52) U.S. Cl.
CPC ........ *H01L 21/67092* (2013.01); *H01L 21/568* (2013.01); *H01L 21/67132* (2013.01); *H01L 21/6835* (2013.01); *H01L 21/78* (2013.01); *H01L 23/3128* (2013.01); *H01L 24/19* (2013.01); *H01L 24/96* (2013.01); *H01L 24/97* (2013.01); *H01L 2221/68322* (2013.01); *H01L 2221/68331* (2013.01); *H01L 2224/0401* (2013.01); *H01L 2224/04105* (2013.01);
(Continued)

(58) Field of Classification Search
CPC .......................... H01L 224/97; H01L 2294/00
USPC .................................... 438/106, 108
See application file for complete search history.

(56) References Cited

U.S. PATENT DOCUMENTS 5,622,900 A 4/1997 Smith
5,776,798 A 7/1998 Quan et al.
(Continued)

FOREIGN PATENT DOCUMENTS

| EP | 1521299 B1 | 8/2008 |
|---|---|---|
| JP | 878505 A | 3/1996 |
| JP | 11251267 A | 9/1999 |

OTHER PUBLICATIONS

PCT/CN2008/001790 International Search Report and Written Opinion mailed Jul. 16, 2009.

*Primary Examiner* — Zandra Smith
*Assistant Examiner* — Andre' C Stevenson
(74) *Attorney, Agent, or Firm* — Jonathan N. Geld (57) ABSTRACT

Methods for forming electronic assemblies are provided. A device substrate having a plurality of electronic components embedded therein is provided. The device substrate is attached to a carrier substrate using an adhesive material. A plurality of cuts are formed through the device substrate to divide the device substrate into a plurality of portions. Each of the plurality of portions includes at least one of the electronic components. A force is applied to each of the plurality of portions in a direction away from the carrier substrate to remove the plurality of portions from the carrier substrate.

7 Claims, 10 Drawing Sheets

(51) Int. Cl.
  *H01L 21/56* (2006.01)
  *H01L 21/683* (2006.01)
  *H01L 21/78* (2006.01)
  *H01L 23/31* (2006.01)
  *H01L 23/00* (2006.01)

(52) U.S. Cl.
  CPC ... *H01L2224/12105* (2013.01); *H01L 2224/20* (2013.01); *H01L 2224/97* (2013.01); *H01L 2924/014* (2013.01); *H01L 2924/01006* (2013.01); *H01L 2924/01013* (2013.01); *H01L 2924/01033* (2013.01); *H01L 2924/10329* (2013.01); *H01L 2924/14* (2013.01); *H01L 2924/15174* (2013.01); *H01L 2924/15311* (2013.01)

(56) References Cited

U.S. PATENT DOCUMENTS

| | | |
|---|---|---|
| 6,319,754 B1 | 11/2001 | Wang et al. |
| 6,762,074 B1 * | 7/2004 | Draney et al. ............... 438/106 |
| 6,919,262 B2 * | 7/2005 | Senoo et al. ................ 438/464 |
| 7,271,491 B1 | 9/2007 | Akram |
| 7,297,412 B2 * | 11/2007 | Connell et al. ............. 428/621 |
| 7,939,368 B2 * | 5/2011 | Chow et al. ................ 438/106 |
| 2002/0069952 A1 * | 6/2002 | Kurosawa ..................... 156/91 |
| 2005/0115065 A1 * | 6/2005 | Wilkins ......................... 29/831 |
| 2006/0273437 A1 * | 12/2006 | Beer et al. .................... 257/680 |
| 2007/0108626 A1 | 5/2007 | Liu et al. |
| 2007/0241078 A1 * | 10/2007 | Pratt et al. ..................... 216/13 |
| 2008/0182363 A1 * | 7/2008 | Amrine et al. ............. 438/118 |
| 2008/0211075 A1 * | 9/2008 | Yang et al. .................. 257/680 |

* cited by examiner

METHOD FOR SINGULATING ELECTRONIC COMPONENTS FROM A SUBSTRATE

TECHNICAL FIELD

The present invention generally relates to a method and system for forming a microelectronic assembly, and more particularly relates to a method for singulating electronic components from a substrate.

BACKGROUND

Integrated circuits are formed on semiconductor substrates (or wafers). The wafers are then sawn into microelectronic die (or "dice"), or semiconductor chips, with each die carrying a respective integrated circuit. Conventionally, each semiconductor chip is connected to a package substrate using either wire bonding or "flip-chip" connections. The packaged chip is then typically mounted to a circuit board, or motherboard, before being installed in a system, such as an electronic or a computing system.

However, technologies have recently been developed which may reduce the need for conventional package substrates. One technology involves embedding the microelectronic die in substrates, or panels, and forming electrical connections from a "device" surface of the die to other portions of the panels. The panels are often formed by attaching one side of a piece of double-sided tape to a support substrate, placing multiple die on the opposing side of the double-sided tape, and dispensing an epoxy over the die. After the epoxy is at least partially cured, the panel is removed from the support substrate.

To complete processing, the panel is then flipped to expose the microelectronic die and attached to another support substrate (e.g., a carrier substrate) also using an adhesive such as a double-sided tape. The backend processing layers, such as dielectric layers, conductive traces, and contact formations (e.g., solder balls) are then formed on the panel over the exposed die. After backend processing, the panel is often removed from the carrier substrate by soaking the entire assembly in tub of chemicals to at least partially dissolve the adhesive. This chemical soak often results in the contact formations corroding, which increases the difficulty in separating the panel into the individual packages.

Accordingly, it is desirable to provide a method for processing encapsulated microelectronic components that reduces, or completely eliminates, the detrimental effects caused by the chemical soak that is used to remove the panel from the carrier substrate. Additionally, other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The various embodiments will hereinafter be described in conjunction with the following drawings, wherein like numerals denote like elements.

DETAILED DESCRIPTION

The following detailed description is merely exemplary in nature and is not intended to limit the application and uses of the various embodiments. Furthermore, there is no intention to be bound by any expressed or implied theory presented in the preceding technical field, background, and brief summary, or the following detailed description. It should also be noted that FIGS. 1-19 are merely illustrative and may not be drawn to scale.

FIG. 1 to FIG. 19 illustrate methods for forming electronic (or microelectronic) assemblies. A device substrate having a plurality of electronic components (e.g., microelectronic die) embedded therein is provided. The device substrate is attached to a carrier substrate with an adhesive material. A plurality of cuts are formed through the device substrate to divide the device substrate into a plurality of portions (or packages). Each portion includes at least one of the electronic components. A force is applied to each of the device substrate portions in a direction away from the carrier substrate to remove the device substrate portions from the carrier substrate.

Figure 1:
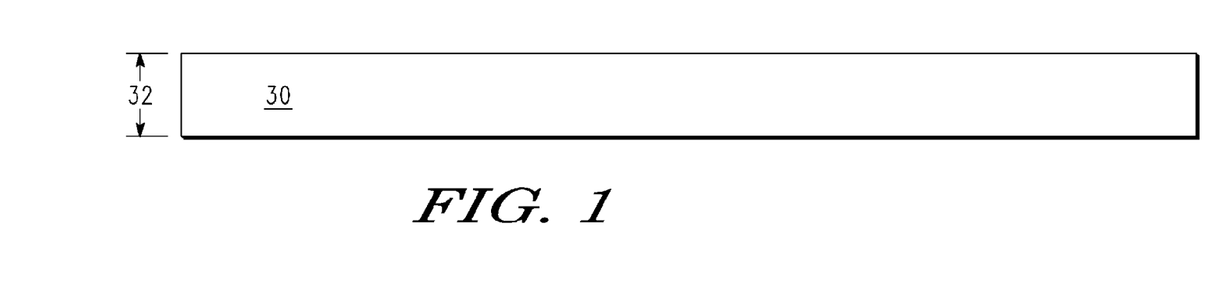
FIG. 1 is a cross-sectional side view of a support substrate.

Referring to FIG. 1, there is illustrated a portion of a support substrate 30. In one embodiment, the support substrate 30 is made of glass and has a thickness 32 of, for example, between 1 and 7 mm. The support substrate 30 may be, for example, circular, rectangular, or square in shape with a width (i.e., diameter or side length) of approximately 200 to 450 mm.

Figure 2:
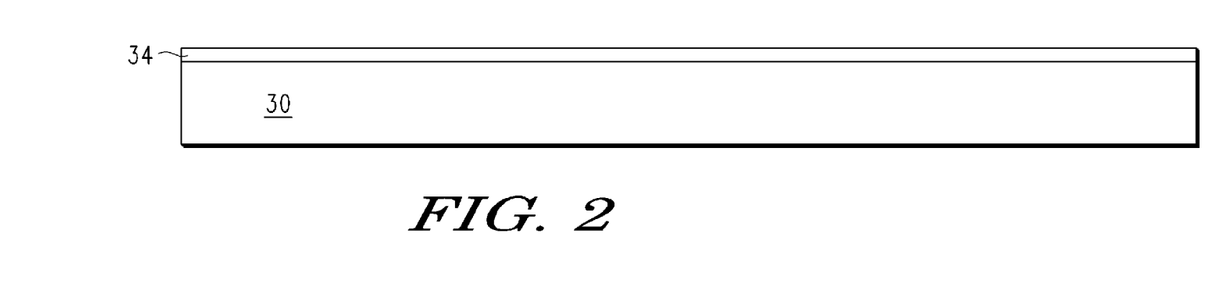
FIG. 2 is a cross-sectional side view of the support substrate of FIG. 1 with a release layer formed thereon.

As illustrated in FIG. 2, a release layer 34 is first placed (or formed) on an upper surface of the support substrate 30. Although not specifically shown, in one embodiment, the release layer 34 includes a thermal release tape and a layer of thermally-degradable adhesive (i.e., a "sacrificial" adhesive) formed on the thermal release tape. The thermal release layer may be oriented on the support substrate 30 so that the thermally-degradable adhesive is between the support substrate 30 and the thermal release tape.

In another embodiment, the support substrate 30 is made of a porous material and the release layer 34 is a layer of solvent-soluble adhesive. The porous material may be one that allows a solvent to pass therethrough, such as a composite material of aluminum oxide embedded in a glass matrix. Other suitable materials include metals, ceramics, plastics, polymers, and combinations thereof. The solvent soluble adhesive may be a rosin-based thermoplastic adhesive. One example of such an adhesive is GENTAK 230, which is available from General Chemical of Parsippany, N.J., U.S.A., which may be coated onto the support substrate 30 by, for example, "spin-coating," as is commonly understood.

Figure 3:
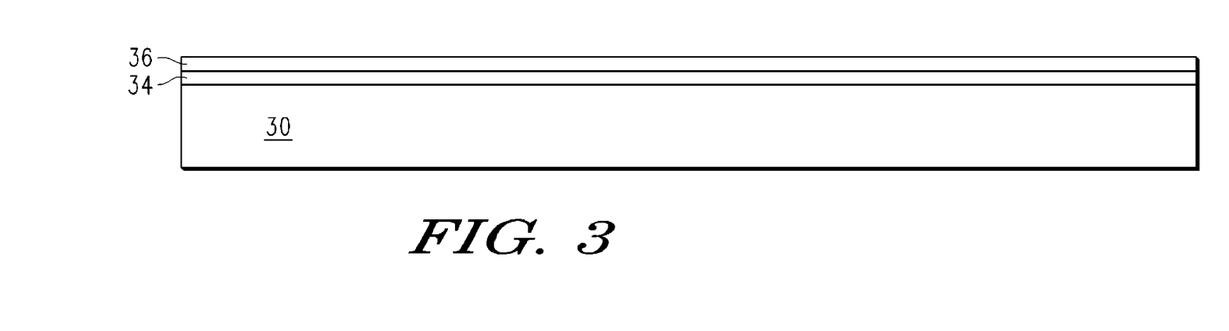
FIG. 3 is a cross-sectional side view of the support substrate of FIG. 2 with a polymeric layer formed over the release layer.

Referring to FIG. 3, a polymeric layer 36 is then formed over the release layer 34, which completely separates the polymeric layer 36 from the support substrate 30. Although not shown, in one embodiment, the polymeric layer 36 includes a polymeric tape and layers of polymeric adhesives on opposing sides of the polymeric tape. In one embodiment, the polymeric tape is made of polyimide and the polymeric adhesive is a silicone adhesive, respectively, as is commonly understood.

Figure 4:
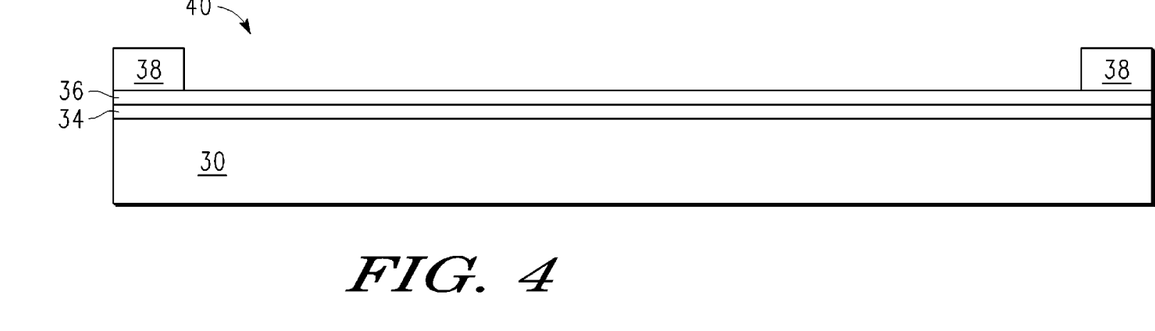
FIG. 4 is a cross-sectional side view of the support substrate of FIG. 3 with a mold frame positioned over the polymeric layer.
Figure 6:
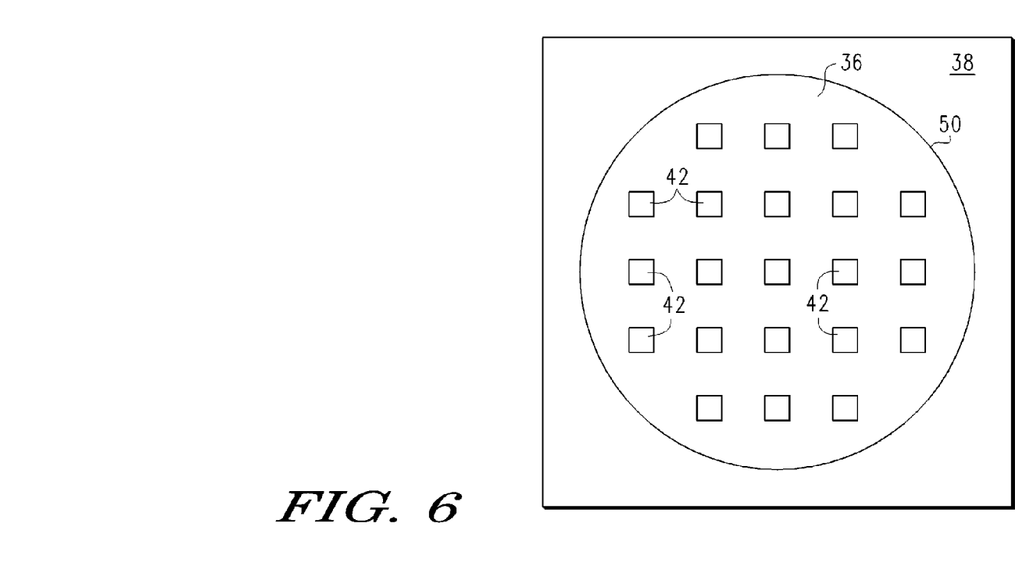
FIG. 6 is a top plan view of the support substrate of FIG. 5.

As shown in FIG. 4, a mold frame 38 is then placed over the polymeric layer 36. The mold frame 38 has an opening 40 at a central portion thereof that lies over a central, exposed portion of the support substrate 30. Although not shown, in one embodiment, an embedded ground plane composed of metal or composite with cavities for microelectronic die may be placed on the support substrate 30 inside the opening 40 of the mold frame 38. Referring ahead to FIG. 6, the opening 40 may be similar in size and shape to the entire support substrate 30, as will be appreciated by one skilled in the art.

Figure 5:
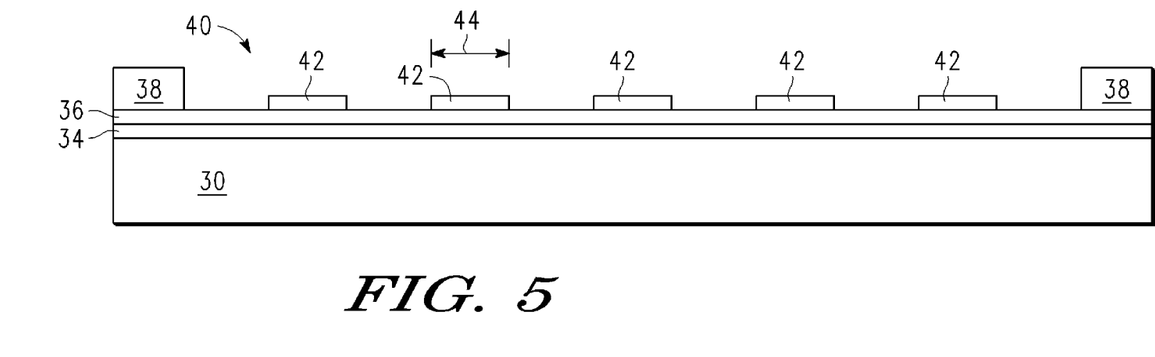
FIG. 5 is a cross-sectional side view of the support substrate of FIG. 4 with microelectronic die placed on the polymeric layer.

Referring to FIG. 5 in combination with FIG. 6, multiple microelectronic die 42 are then placed within the opening 40 of the mold frame 48 and onto the polymeric layer 36. In one embodiment, each die 42 includes a substrate made of a semiconductor material, such as gallium arsenide (GaAs), gallium nitride (GaN), or silicon (Si) with an integrated circuit formed thereon (or therein), which include a plurality of semiconductor devices, such as transistors. In the depicted embodiment, the die 42 are substantially square (or rectangular) with a side length (or die width) 44 of, for example, between 1 and 20 mm and a thickness (not shown) of, for example, between 75 and 800 μm. Referring specifically to FIG. 6, the die 42 are evenly spaced within the opening 40 of the mold frame 38. As will be appreciated by one skilled in the art, in one embodiment, the placement of the die 42 may be controlled to account for physical changes in the various components of the assembly shown, such as expansion and/or compression due to variations in the coefficients of thermal expansion (CTE) of the various materials used.

Figure 7:
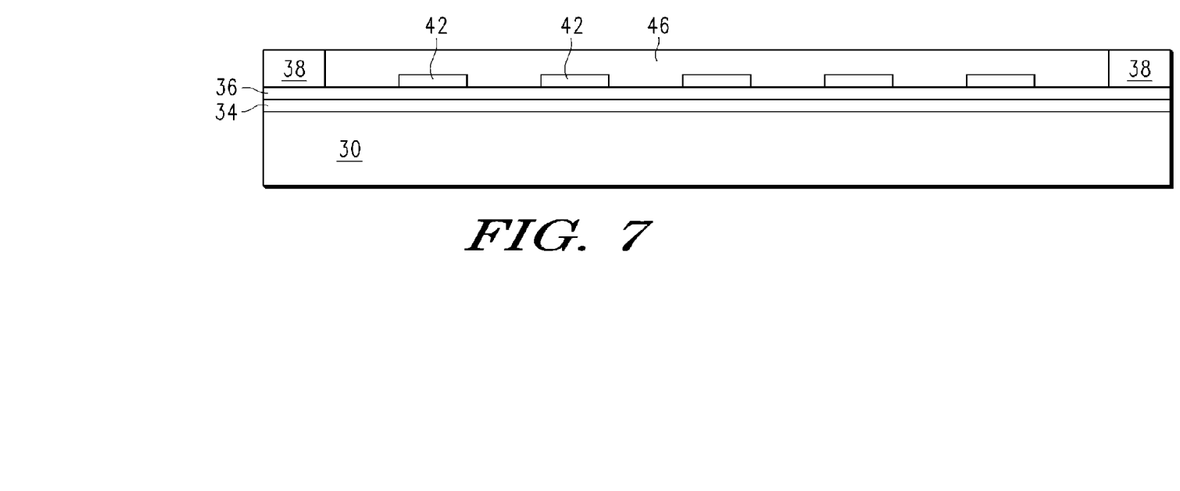
FIG. 7 is a cross-sectional side view of the support substrate of FIG. 5 with an encapsulation material deposited over the microelectronic die.

Next, as illustrated in FIG. 7, an encapsulation material 46 is deposited (or formed) over the microelectronic die 42 and on the exposed portions of the polymeric layer 36 within the opening 40 of the mold frame 38. Although not shown, the encapsulation material 46 may be deposited to have a depth (or thickness) of, for example, approximately 0.65 mm, which may be similar to a thickness of the mold frame 38 (as measured over the polymeric layer 36). In one embodiment, the encapsulation material is a silica-filled epoxy with a final cure temperature of, for example, between 140 and 150° C. and is printed or dispensed into the opening 40, as is commonly understood. Other embodiments may use other types of encapsulation materials and other processes to deposit the encapsulation material 46, such as screen printing, extrusion coating, transfer molding, ejection molding, and "glob top."

Figure 8:
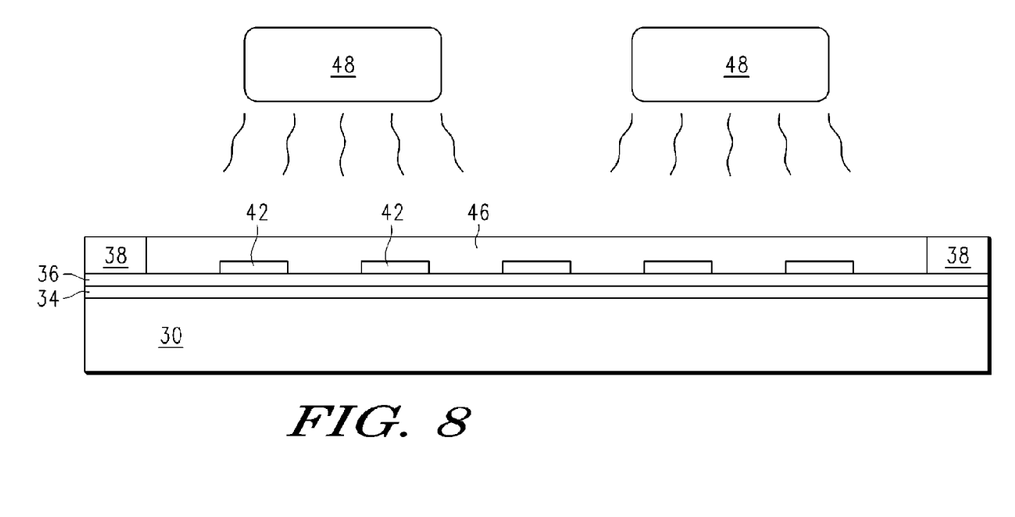
FIG. 8 is a cross-sectional side view of the support substrate of FIG. 7 undergoing a heating process.

As shown in FIG. 8, the support substrate 30, along with the various components formed thereon, are then heated or "baked" in, for example, an oven with heating elements 48, as is commonly understood. In one embodiment, the support substrate 30 is baked at approximately 100° C. (i.e., a partial cure temperature) for 60 minutes, which only partially cures (e.g., 80% cure) the encapsulation material 46. Additionally, in an embodiment in which the release layer 34 includes a thermally-degradable adhesive, the partial cure temperature is below the thermal breakdown temperature of the thermally-degradable adhesive such that a strong adhesive bond remains between the support substrate 30 and the thermal release tape after the heating process described above. However, in embodiments not utilizing the thermally-degradable adhesive, the baking process depicted in FIG. 8 may completely cure the encapsulation material 46.

Figure 9:
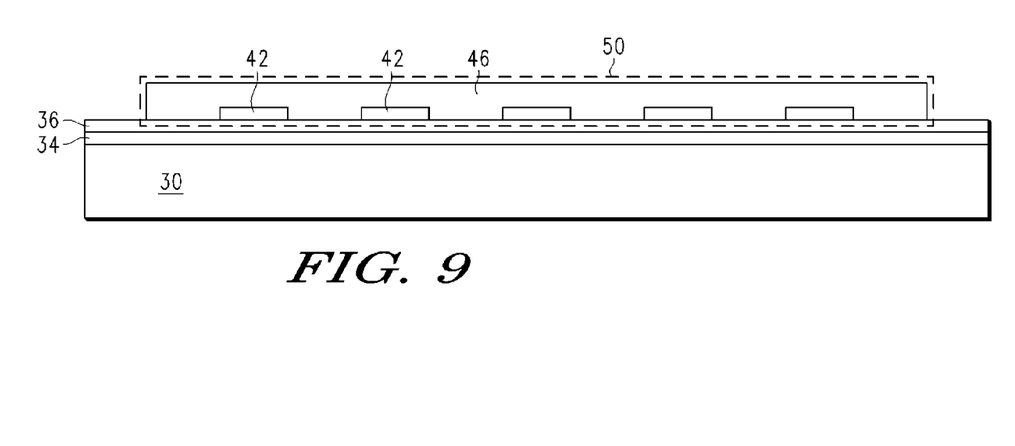
FIG. 9 is a cross-sectional side view of the support substrate after undergoing the heating process shown in FIG. 8 with the mold frame removed.
Figure 10:
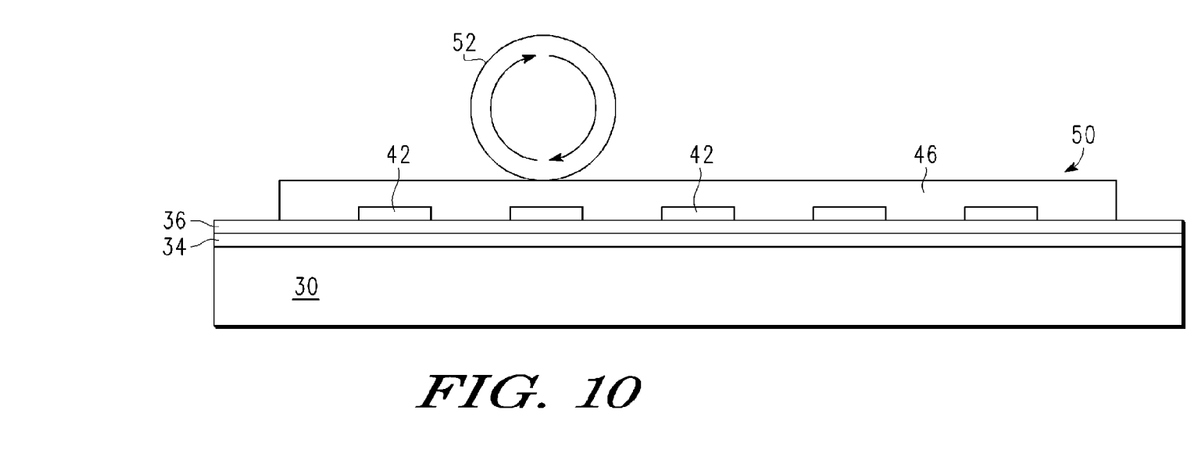
FIG. 10 is a cross-sectional side view of the support substrate of FIG. 9 illustrating the encapsulation material undergoing a grinding process.

Referring to FIG. 9, the mold frame 38 is then removed. After the curing described above, the encapsulation material 46 becomes at least partially rigid and forms a device panel (or an encapsulated structure) 50. The device panel, which may also be referred to as a device substrate, 50 has an initial thickness similar to the depth of the encapsulation material 46 and includes the microelectronic die 42 embedded therein. As illustrated in FIG. 10, an exposed surface of the device panel 50 then undergoes a grinding (and/or polishing and/or abrasion) process to reduce the thickness of the device panel 50 to a reduced, or "thinned," thickness. In the depicted embodiment, the grinding process is performed using a polishing or grinding head (or polishing element) 52 that is placed into contact with and pressed against the device panel 50 while being rotated and moved across the exposed surface of the device panel 50.

Figure 11:
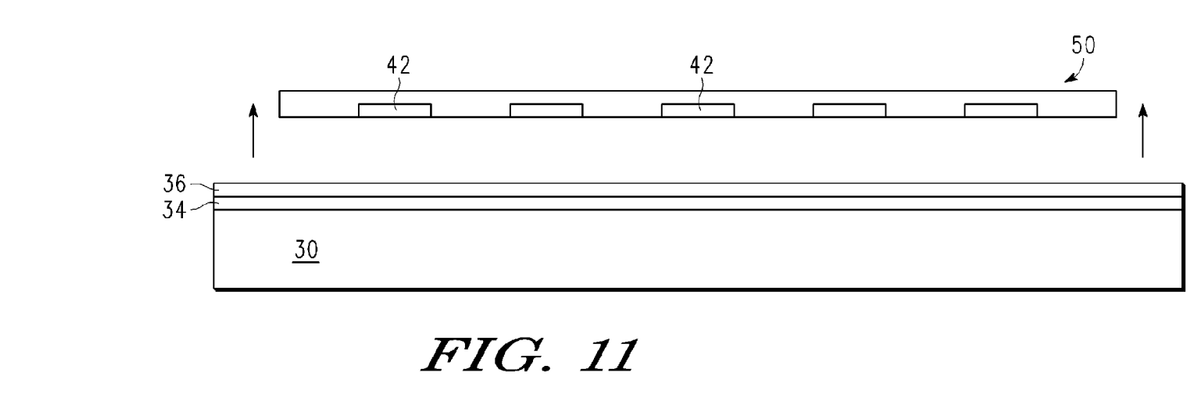
FIG. 11 is a cross-sectional side view of the support substrate of FIG. 10 illustrating the encapsulation material, along with the microelectronic die, being separated from the polymeric layer.

In the embodiment in which the release layer 34 includes a thermally-degradable adhesive, the support substrate 30 may then undergo a second heating process at a temperature greater than or equal to the breakdown temperature of the thermally-degradable adhesive and the final cure temperature of the encapsulation material 46, such as between 100 and 200° C. As such, the thermal release tape may be easily peeled from the support substrate 30. The second bake may take place in an oven and have a duration of, for example, between 10 and 90 minutes. In the embodiment in which the solvent soluble adhesive is used, the support substrate 30 is then soaked in the particular solvent in which the adhesive dissolves for a duration of, for example, between 30 and 120 minutes. The solvent degrades the adhesive to a point such that the polymeric layer 36 may be easily removed. Referring to FIG. 11, the device panel 50 is then removed from the support substrate 30.

Figure 12:
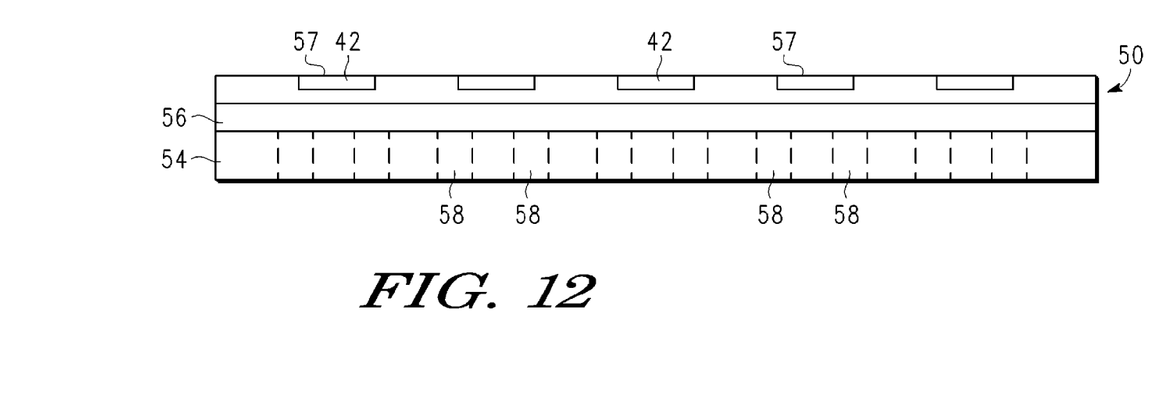
FIG. 12 is a cross-sectional side view of a carrier substrate with the encapsulation material of FIG. 11 attached thereto.

As shown in FIG. 12, the device panel 50 is then attached to a carrier substrate 54 with an adhesive layer 56. As indicated, the device panel 50 may be flipped such that device surfaces 57 of the microelectronic die 42 are exposed at what is now an upper surface of the device panel 50. The carrier substrate 54 is, in one embodiment, made of a ceramic material and has a plurality of openings 58 therethrough, which extend to opposing sides thereof. As is evident from FIG. 12, each of the openings 58 is positioned such that it is aligned, or nearly aligned, with one of the microelectronic die 42. As shown, the carrier substrate 54 has a width similar to (i.e., substantially greater than or equal to) the diameter of the device panel 50 to provide support for the entire device panel 50.

In one embodiment, the adhesive layer 56 is a transfer adhesive and includes no internal substrate, such as a tape. In other embodiment, the adhesive layer 56 is similar to the polymeric layer 40 described above. The adhesive layer 56 may have a thickness (not shown) of, for example, between 25 and 75 μm.

Figure 13:
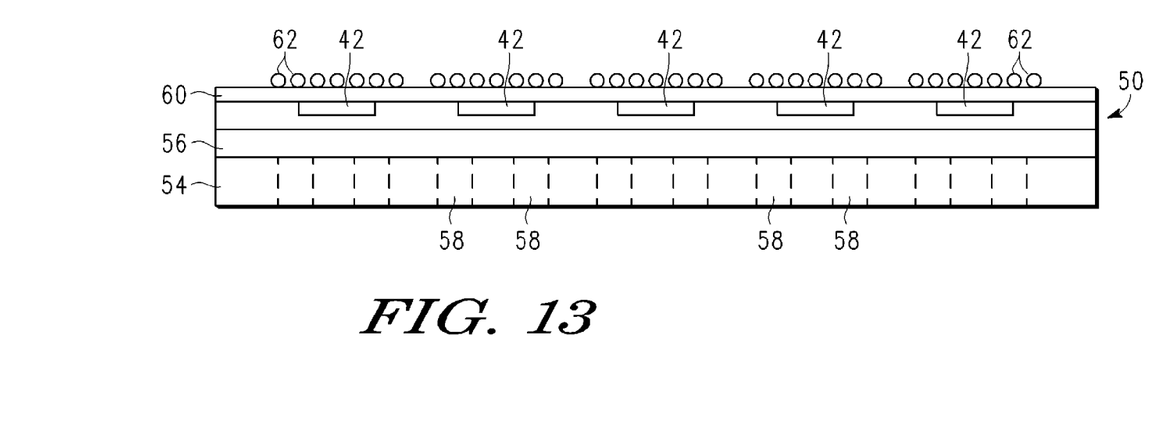
FIG. 13 is a cross-sectional side view of the carrier substrate of FIG. 12 with a build-up layer and contact formations formed on the encapsulation material.
Figure 14:
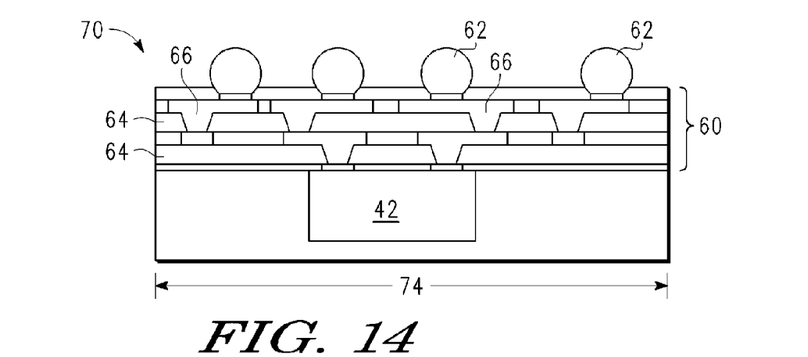
FIG. 14 is a cross-sectional side view of an integrated circuit package formed from the encapsulation material and microelectronic die of FIG. 13.

Referring to FIGS. 13 and 14, a build-up (or backend) layer 60 and contact formations 62 are then formed on the exposed side of the device panel 50. As is commonly understood, the build-up layer 60 includes a plurality of insulating (i.e., dielectric) layers 64 and conductors 66 (e.g., traces and vias), which may be formed using standard complimentary metal-oxide semiconductor (CMOS) processing steps. The contact formations 62, in the depicted embodiment, are conductive solder balls, which may be formed using known techniques. Each of the contact formations 62 is electrically connected to the integrated circuit within one of the microelectronic die 42.

Figure 15:
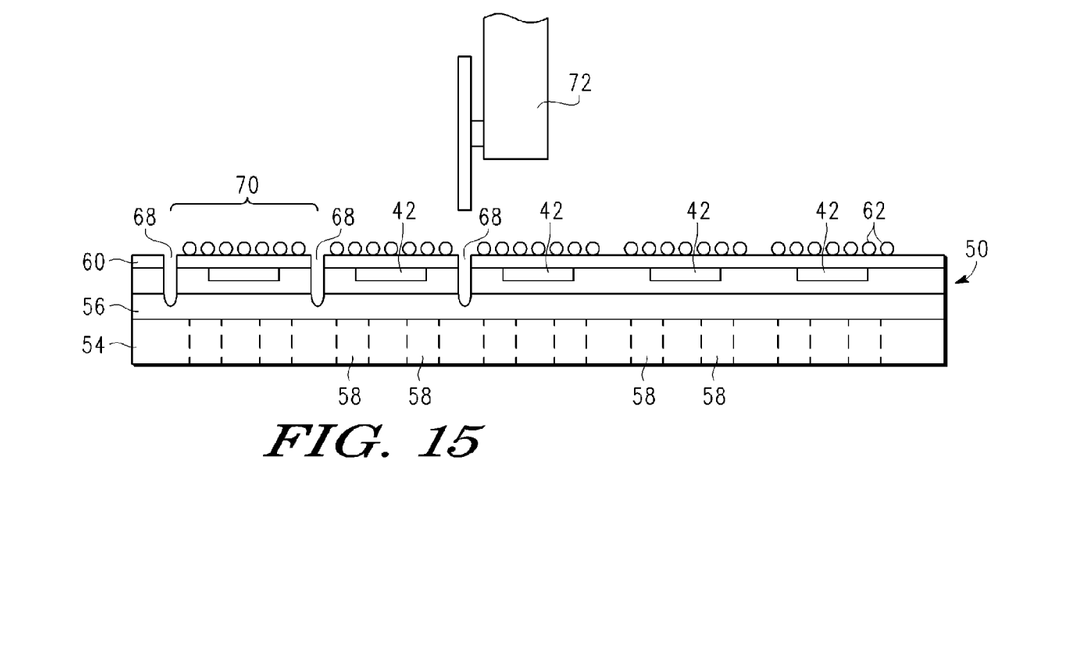
FIG. 15 is a cross-sectional side view of the carrier substrate of FIG. 13 illustrating the encapsulation material undergoing a sawing process.
Figure 16:
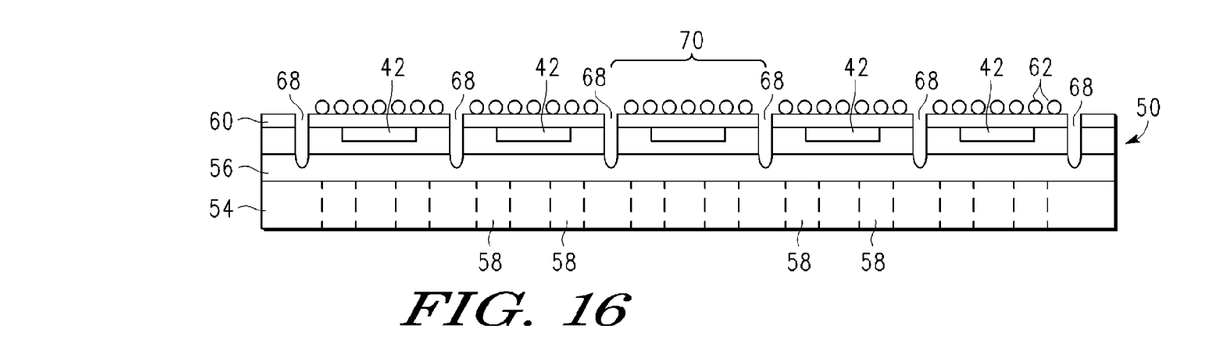
FIG. 16 is a cross-sectional side view of the carrier substrate of FIG. 15 after the encapsulation material has undergone the sawing process of FIG. 15.
Figure 17:
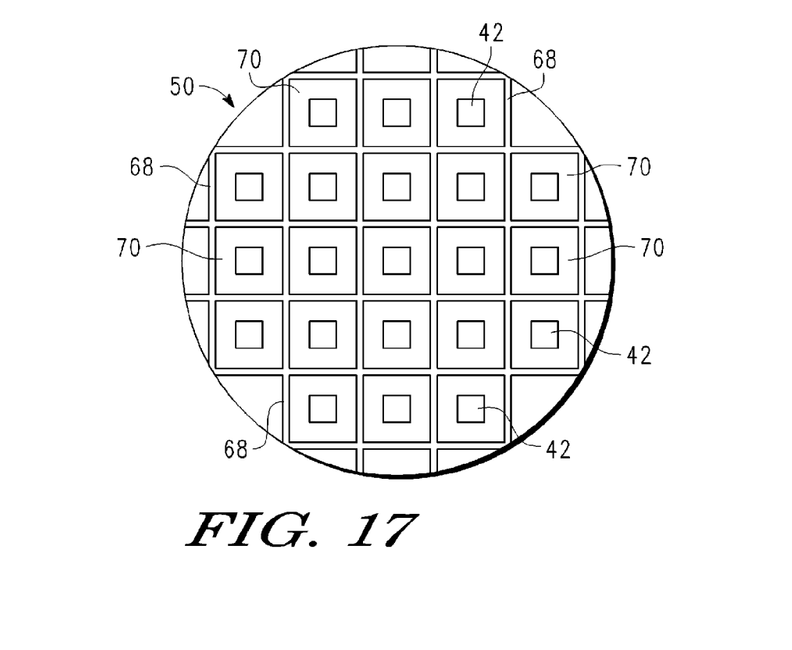
FIG. 17 is a top plan view of the carrier substrate of FIG. 16.

Referring now to FIGS. 15, 16, and 17, in combination with FIG. 14, a series of cuts 68 are then made through the build-up layer 60 to divide the device panel 50 (as well as the build-up layer 60 and the contact formations 62) into a plurality device panel portions (or integrated circuit packages) 70. As shown, the cuts 68 extend completely through, the build-up layer 60 and the device panel 50, and partially into the adhesive layer 56, but do not extend into the carrier substrate 54. In one embodiment, the cuts 68 are made using a diamond saw 72, as is commonly understood. The device panels portions 70 are, in one embodiment, substantially square with side lengths (or portion widths) 74 of, for example, between 3 and 35 mm. As is apparent in FIG. 14, the side lengths 74 are greater than the die widths 44 (FIG. 5).

Figure 18:
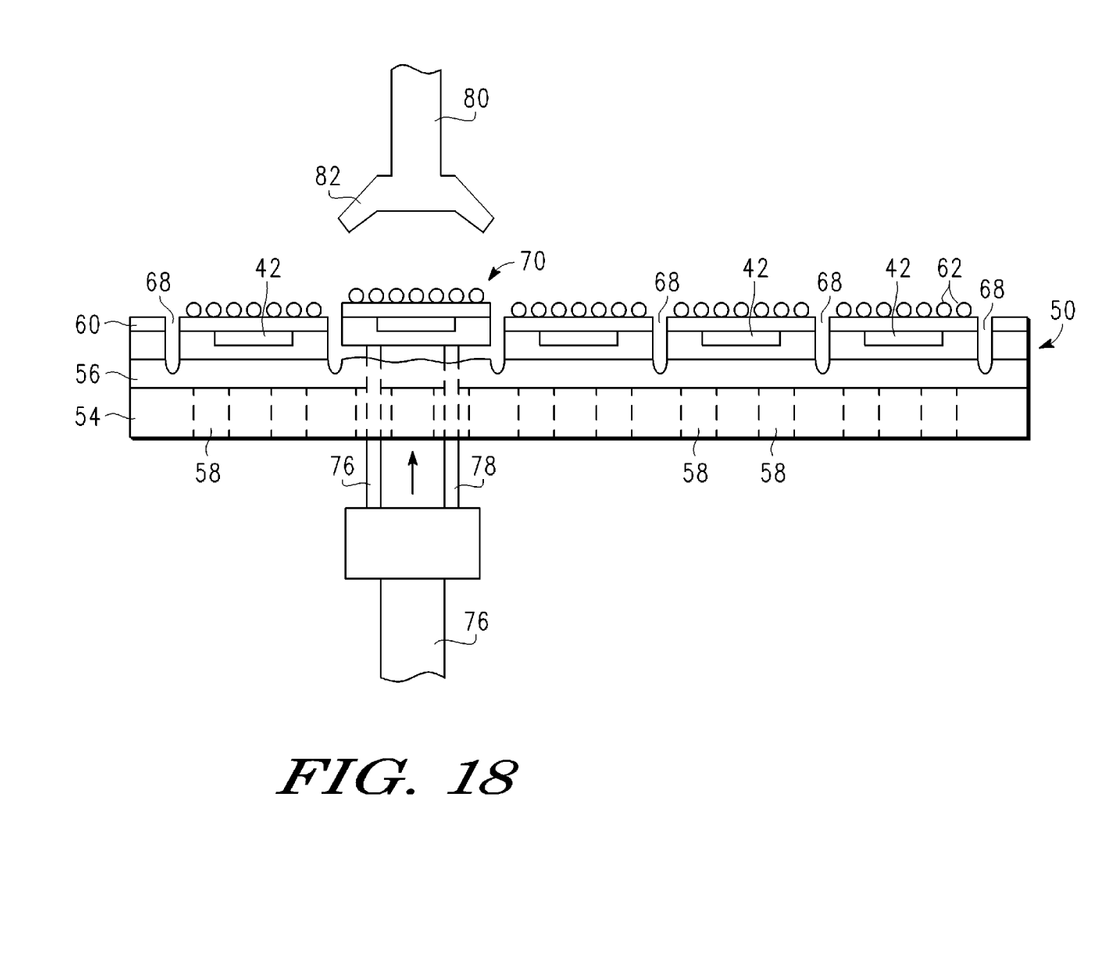
FIGS. 18 and 19 are cross-sectional side views of the carrier substrate of FIG. 16 illustrating the removal of an integrated circuit package, similar to that of FIG. 14, from the carrier substrate.
Figure 19:
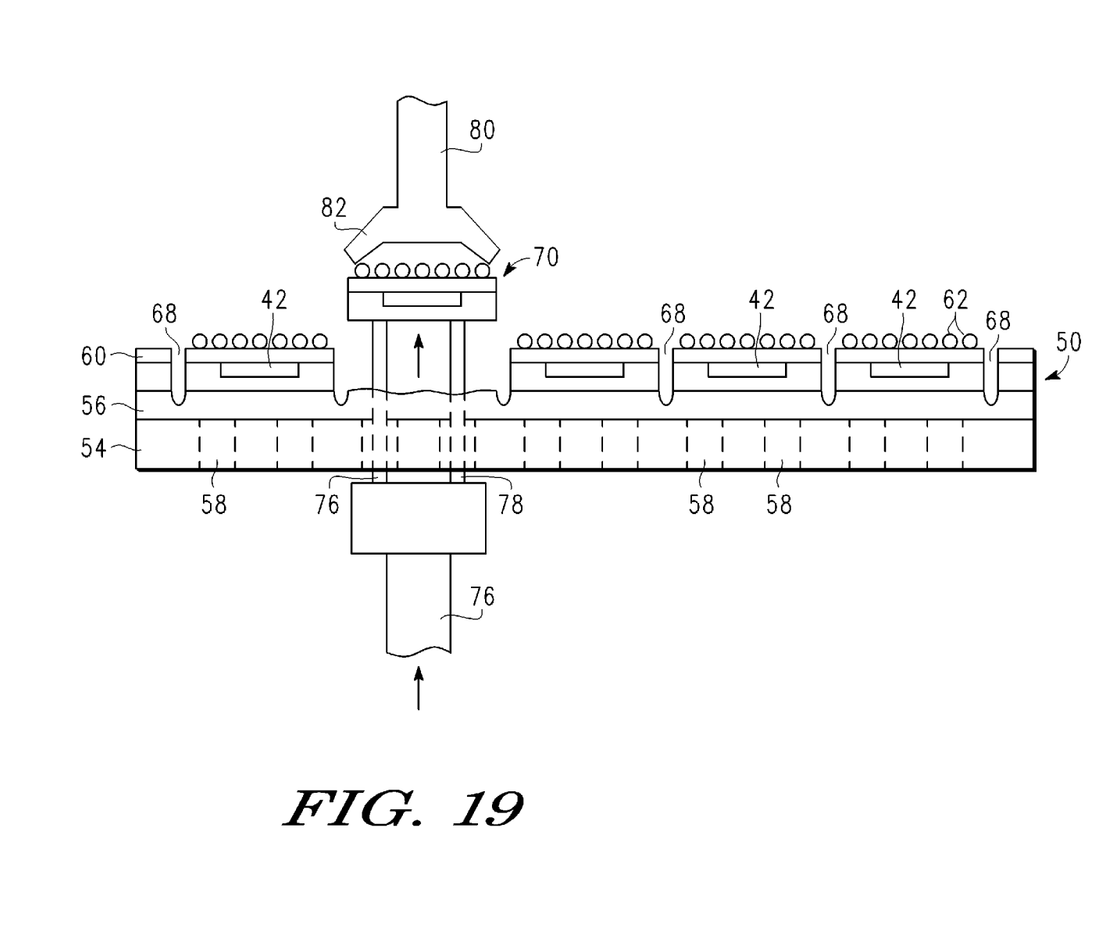

After the cuts 68 are formed, and the device panel 50 has been divided into the device panel portions 70, each of the portions 70 is then removed from the remainder of the device panel 50 as shown in FIGS. 18 and 19. As illustrated, for each of the device panel portions 70, an ejector head 76 having pins (or ejection members) 78 is positioned below the carrier substrate 54, and a pick head 80 with a rubber tip 82 is positioned above the device panel 50. The ejector head 76 and the pick head 80 are aligned on directly opposing sides of a selected device panel portion 70. The ejector head 76 is moved upwards such that the pins 78 are inserted through the openings 58 in the carrier substrate 54. The pins 78 pass through the adhesive layer 56 and press upwards on the particular device panel portion 70. The force exerted on the device panel portion 70 causes it to be lift, and thus be singulated, from the carrier substrate 54. In the embodiment shown, because the pins 78 pass through the adhesive layer 56, and due to the variations in the bonding strength of the adhesive with different materials, the adhesive layer 56 substantially remains on the carrier substrate 54 as the device panel portion 70 is removed. The pins 78 lift the device panel portion upwards into the rubber tip 82 of the pick head 80, which holds the device panel portion 70 using, for example, a vacuum effect. The pick head 80 may then place the device panel portion 70 for installation into an electronic or computing system, such as a circuit board (not shown). The process shown in FIGS. 18 and 19 may then be repeated for all of the device panel portions 70 within the device panel 50. Of particular interest is that the device panel portions 70 are removed from the carrier substrate 54 without the use of a chemical soak to dissolve the adhesive layer 56.

One advantage of the methods described above is that because the device panel portions are removed from the carrier substrate without the use of a chemical soak, any complications that may arise from the chemical soak (e.g., corrosion of the contact formations and/or warping of the device panel) are completely avoided. Another advantage is that the manufacturing time required for each device panel is reduced (e.g., by as much as 2-3 hours). A further advantage is that the method describe above, at least in one embodiment, utilizes carrier substrates that are used in processing systems that use chemical soaks and thus already include the openings therethrough as described above (i.e., the openings conventionally are used to allow the chemicals to drain). As a result, manufacturing costs are minimized.

A method is provided. A device substrate having a plurality of electronic components embedded therein is provided. The device substrate is attached to a carrier substrate using an adhesive material. A plurality of cuts are formed through the device substrate to divide the device substrate into a plurality of portions. Each of the plurality of portions includes at least one of the electronic components. A force is applied to each of the plurality of portions in a direction away from the carrier substrate to remove the plurality of portions from the carrier substrate.

The plurality of cuts may extend completely through the device substrate. The plurality of cuts may extend partially through the adhesive material. In one embodiment, the plurality of cuts do not extend into the carrier substrate.

The carrier substrate may include a plurality of openings therethrough. Each of the plurality of portions may be aligned with at least one of the openings. The applying the force on each of the plurality of portions in a direction away from the carrier substrate to remove the plurality of portions from the carrier substrate may include inserting at least one ejection member through the openings in the carrier substrate from a side opposite the device substrate to lift a selected one of the plurality of portions from the carrier substrate.

The adhesive material may be a solvent soluble adhesive, and the adhesive material may not be exposed to a solvent in which the solvent soluble adhesive dissolves before device substrate portions are removed from the carrier substrate.

Each of the plurality of electronic components may include a plurality of microelectronic devices. The plurality of microelectronic devices of each of the plurality of electronic components may jointly form an integrated circuit. Each of the plurality of electronic components may each include a microelectronic die having the respective integrated circuit formed thereon.

The plurality of portions may have a portion width, and each of the plurality of microelectronic die may have a die width. The portion width may be greater than the die width. The plurality of portions may each have a plurality of insulating layers and contact formations on a side thereof opposing the carrier substrate. The contact formations may be electrically connected to the respective integrated circuit.

A method for forming electronic assemblies is provided. Electronic components within a device panel are provided. The device panel is attached to a carrier substrate using an adhesive material. The carrier substrate may have a plurality of openings therethrough. A plurality of cuts are formed through the device panel to divide the device panel into a plurality of device panel portions. Each device panel portion includes at least one of the electronic components and is aligned with one of the openings through the carrier substrate. At least one ejection member is inserted through openings in the carrier substrate from a side opposite the device panel to lift the device panel portions from the carrier substrate.

A plurality of insulating layers and contact formations may be formed on a side of the device panel opposing the carrier substrate after the attaching the device panel to the carrier substrate. Each of the contact formations may be electrically connected to a respective electronic component.

Each of the plurality of electronic devices may include a microelectronic die having an integrated circuit formed thereon. The plurality of device panel portions may have a portion width, and the microelectronic die may have a die width. The portion width may be greater than the die width.

The plurality of cuts may extend completely through the device panel and partially through the adhesive material. In one embodiment, the plurality of cuts do not extend into the carrier substrate.

A method for forming microelectronic assemblies is provided. A plurality of microelectronic die are encapsulated in an encapsulation material to form a device panel. Each of the plurality of microelectronic die has an integrated circuit formed thereon and has a die width. The device panel is attached to a carrier substrate using an adhesive material. The carrier substrate has a plurality of openings therethrough. A plurality of cuts are formed through the device panel to divide the device panel into a plurality of device panel portions. Each of the plurality of device panel portion includes at least one of the plurality of microelectronic die, is aligned with one of the plurality of openings through the carrier substrate, and has a portion width that is greater than the die width. The plurality of cuts extend completely through the device panel and partially into the adhesive material. At least one ejection member is inserted through openings in the carrier substrate from a side opposite the device panel to remove the plurality of device panel portions from the carrier substrate.

In one embodiment, the plurality of cuts do not extend into the carrier substrate. A plurality of insulating layers and contact formations may be formed on a side of the device panel opposing the carrier substrate after the attaching the device panel to the carrier substrate. Each of the contact formations may be electrically connected to a respective microelectronic die.

The adhesive material may be a solvent soluble adhesive, and the adhesive material may not be exposed to a solvent in which the solvent soluble adhesive dissolves before device panel portions are removed from the carrier substrate.

The device panel may have a panel width, and the carrier substrate may have a carrier substrate width. The carrier substrate width may be substantially greater than or equal to the panel width.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming electronic assemblies comprising:
   encapsulating electronic components within a device panel;
   attaching the device panel to a carrier substrate using an adhesive material, the carrier substrate having a plurality of openings therethrough at the time of said attaching, wherein the carrier substrate is below the entirety of the device panel and supports the device panel, and the carrier substrate has a width greater than or equal to that of the device panel;
   forming a plurality of cuts through the device panel to divide the device panel into a plurality of device panel portions, each device panel portion comprising at least one of the electronic components and being aligned with one of the openings through the carrier substrate, wherein each cut of the plurality of cuts extends into the adhesive material but not into the carrier substrate; and
   inserting at least one ejection member through openings in the carrier substrate from a side opposite the device panel to lift the plurality of device panel portions from the carrier substrate.

2. The method of claim 1, further comprising forming a plurality of insulating layers and contact formations on a side of the device panel opposing the carrier substrate after the attaching the device panel to the carrier substrate, each of the contact formations being electrically connected to a respective electronic component.

3. The method of claim 2, wherein each of the plurality of electronic devices comprises a microelectronic die having an integrated circuit formed thereon.

4. The method of claim 3, wherein the plurality of device panel portions have a portion width and the microelectronic die have a die width, the portion width being greater than the die width.

5. A method for forming microelectronic assemblies comprising:
   encapsulating a plurality of microelectronic die in an encapsulation material to form a device panel, each of the plurality of microelectronic die having an integrated circuit formed thereon and having a die width;
   attaching the device panel to a carrier substrate using an adhesive material, wherein the carrier substrate has a plurality of openings therethrough, the carrier substrate is below the entirety of the device panel and supports the device panel, and the carrier substrate has a width greater than or equal to that of the device panel;
   forming a plurality of cuts through the device panel to divide the device panel into a plurality of device panel portions, each of the plurality of device panel portions comprising at least one of the plurality of microelectronic die, being aligned with one of the plurality of openings through the carrier substrate, and having a portion width that is greater than the die width and the plurality of cuts extending completely through the device panel and partially into the adhesive material and do not extend into the carrier substrate; and
   inserting at least one ejection member through openings in the carrier substrate from a side opposite the device panel to remove the plurality of device panel portions from the carrier substrate.

6. The method of claim 5, further comprising forming a plurality of insulating layers and contact formations on a side of the device panel opposing the carrier substrate after the attaching the device panel to the carrier substrate, each of the contact formations being electrically connected to a respective microelectronic die.

7. The method of claim 6, wherein the adhesive material is a solvent soluble adhesive and the adhesive material is not exposed to a solvent in which the solvent soluble adhesive dissolves before device panel portions are removed from the carrier substrate.

* * * * *